Figure 1:
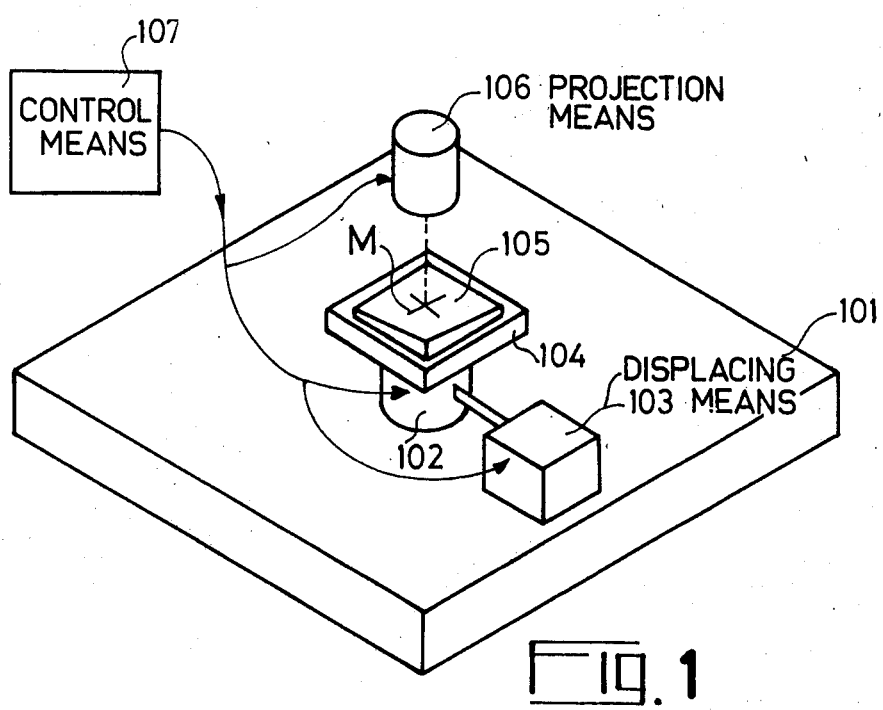

United States Patent [19]

Lacombat et al.

[11] 4,239,381
[45] Dec. 16, 1980

[54] OPTICAL PROJECTION SYSTEM EQUIPPED WITH A PLATE POSITIONER

[75] Inventors: Michel Lacombat; Jean C. Graffin; Robert Antoine, all of Paris, France

[73] Assignee: Thomson-CSF, Paris, France

[21] Appl. No.: 49,500

[22] Filed: Jun. 19, 1979

[30] Foreign Application Priority Data

Jun. 23, 1978 [FR] France ............... 78 18835

[51] Int. Cl.³ .................. G03B 27/60; G03B 27/42
[52] U.S. Cl. .......................... 355/53; 355/73
[58] Field of Search ............ 355/53, 73, 76, 39, 355/125

[56] References Cited

U.S. PATENT DOCUMENTS

| | | | |
|---|---|---|---|
| 3,064,524 | 11/1962 | Durst | 355/73 |
| 3,541,338 | 11/1970 | Duda et al. | 355/53 X |
| 3,704,657 | 12/1972 | Sliwkowski et al. | 355/53 X |
| 3,704,945 | 12/1972 | Denis et al. | 355/53 X |
| 4,084,903 | 4/1978 | Pircher | 355/53 |
| 4,184,764 | 1/1980 | Bailey et al. | 355/73 X |

FOREIGN PATENT DOCUMENTS 2406827  8/1974  Fed. Rep. of Germany ............ 355/53

*Primary Examiner*—Donald Griffin
*Attorney, Agent, or Firm*—Cushman, Darby & Cushman

[57] ABSTRACT

In order to position a sensitized plate in the image plane of a projection lens, the optical projection system is provided with a set of extensible jacks placed in a circle around the lens, the desired image plane being defined by the ends of the jacks when they are in the outwardly displaced position. The plate can then be placed against the ends of the jacks by means of a spherical-bearing unit which is locked in position, whereupon the jacks are caused to withdraw and the plate can be displaced in the image plane while remaining at the focusing distance. The invention is well suited to the construction of photorepeaters.

5 Claims, 5 Drawing Figures

OPTICAL PROJECTION SYSTEM EQUIPPED WITH A PLATE POSITIONER

This invention relates to optical projection systems equipped with plate positioners. An optical system of this type comprises at least one lens which is intended either to project an image onto the plate after this latter has been placed by the positioner or on the contrary to form an image of a pattern carried by said plate on a visual display screen, for example.

In one particular design of an optical system of this type known as a photorepeater, the scaled-down image of a pattern can be projected onto a large number of adjacent segments of a photosensitive layer which has been deposited on the flat surface of a plate of this type. Since the desired level of accuracy is of the order of one micrometer, the plate must be positioned with respect to the lens both for distance and angular position-setting with a degree of accuracy of the same order. A positioner which permits the achievement of this result is described in U.S. patent application No. 879,537 entitled "Loading device" and filed on April 10th, 1978 in the name of the present Applicant. This positioner comprises a spherical bearing which permits of adjustment both for distance and for angular position-setting, and a pivotal shutter. The plate positioning plane is defined by said pivotal shutter in one position of adjustment. The sensitive face of said plate is then clamped against the shutter by the spherical bearing which is then locked in the position defined by this clamping action. The shutter then performs a pivotal movement of displacement to a second position, thus uncovering the sensitive face which has thus been placed in the positioning plane.

A pivotal shutter of this type constitutes an intermediate component which is not directly associated with the projection lens and which, in the course of time, may acquire play about its axis of pivotal motion. Even a very small amount of play, however, is liable to impair the accuracy of positioning.

Moreover, the entire surface of the shutter is applied against the sensitive layer, thereby increasing the potential danger of damage to said layer.

Finally, it is necessary to conform to a strict utilization procedure in order to prevent any damage either to the plate or above all to the elements of the photocomposer.

The invention proposes to overcome these disadvantages by employing a set of jacks which are rigidly fixed to the lens ring, the desired reference plane being determined in one position-setting by means of the ends of said jacks. A suitable spherical bearing of the type cited earlier, for example, serves to apply the sensitized plate against said jacks. The spherical bearing is then locked in position and the jacks are withdrawn. The different control circuits are interconnected by means of logical elements which prevent any errors of operation.

Figure 2:
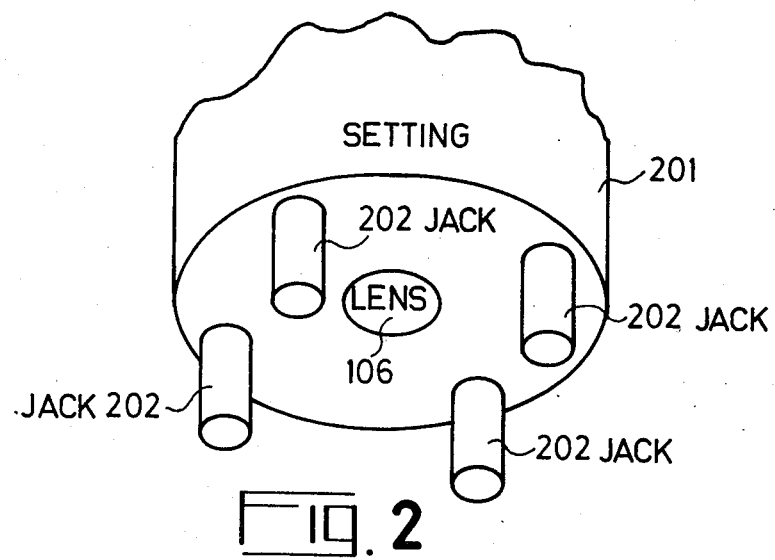
Figure 3:
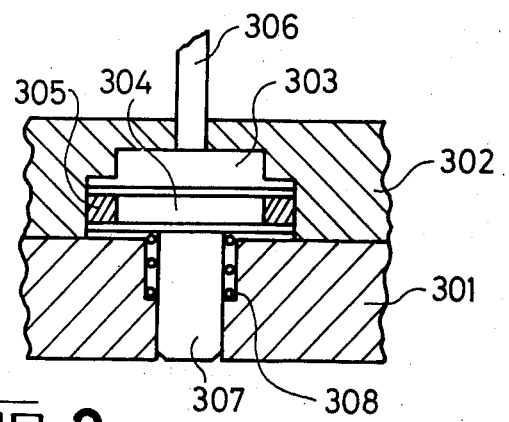
Figure 4:
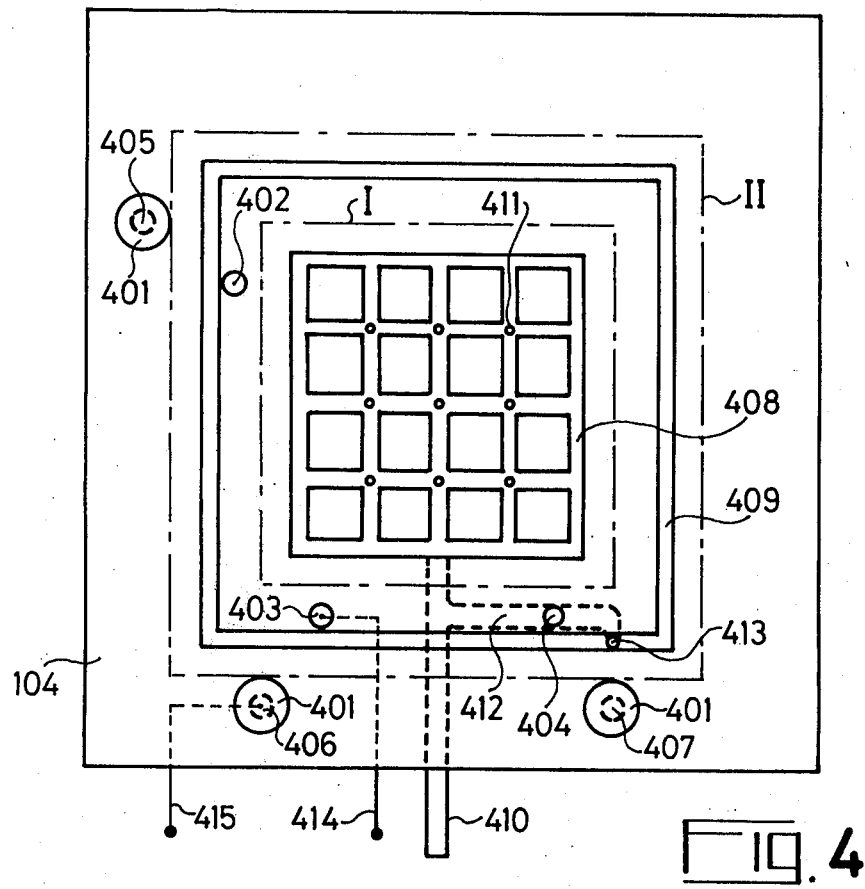
Figure 5:
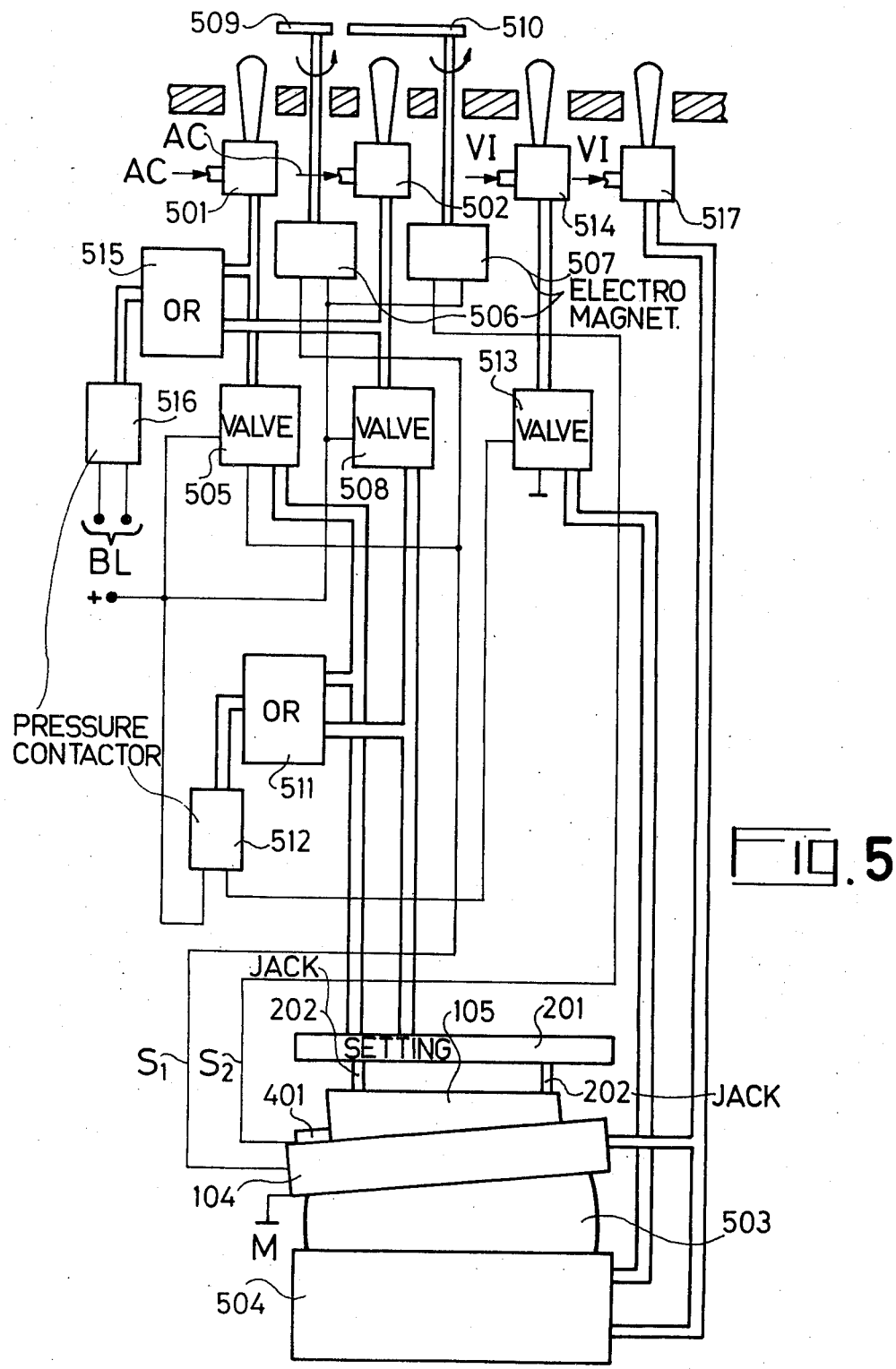

Further distinctive features and advantages of the invention will be clearly brought out from the following description which is presented by way of example and not in any limiting sense, reference being had to the accompanying figures in which:

FIG. 1 is a partial diagrammatic view of a photorepeater;
FIG. 2 shows a lens mount equipped with reference jacks;
FIG. 3 is a sectional view of one of said jacks;
FIG. 4 is a plan view of a plate support table;
FIG. 5 is a diagram of a fluidic and electric control system.

The photorepeater which is shown partially and schematically in FIG. 1 comprises a platform 101 which determines a first reference plane. A spherical bearing 102 is capable of displacement in all directions on said platform under the action of a displacement mechanism 103. By way of example, said spherical bearing can be of the type described in our cited patent application No. 879,537. The spherical bearing is adapted to carry a table 104 which in turn carries a sensitized plate 105. Although the two opposite surfaces of a plate of this type are polished and substantially parallel, polishing to the desired degree of surface finish has been carried out on only one of these faces since it is not possible in practice either to guarantee accuracy of parallelism of the other face with respect to this latter to the same extent or to guarantee accuracy of plate thickness. A sensitive layer is accordingly deposited on that face which has been prepared with the greatest care whilst the other face of the plate rests on the table 104.

In addition, the photorepeater comprises projection means, of which only a projection lens 106 has been shown in the figure. Said means are fixed in a rigid and accurate manner with respect to the platform 101 so as to project a pattern (represented in the figure by a cross) in a second reference plane which is strictly parallel to the first reference plane and located at a predetermined and fixed distance from this latter.

In order to ensure that said pattern is projected onto the sensitive face of the plate 105 and remains thereon during the displacements of the assembly consisting of spherical bearing, table and plate on the platform 101, said sensitive face must be placed in said second plane at the time of an initial adjustment. This is the design function of the spherical bearing 102 which serves to correct any errors of thickness and parallelism of the plate 105 under the action of a control unit 107 which also controls the movements of the mechanism 103 as well as the positioning jacks defined hereinafter.

In order to operate the spherical bearing 102, it is necessary to define the second reference plane by means of mechanical elements. Thus the spherical bearing first moves upwards in order to apply the sensitive face of the plate 105 against said mechanical elements. The spherical bearing is then locked in the position in which it has stopped, thus immobilizing the assembly consisting of spherical bearing, table and plate, with the result that the sensitive surface remains fixed in the second reference plane.

FIG. 2 is a partial view showing the mount 201 of the lens 106. There has been placed around the periphery of said lens mount a set of jacks 202 which are capable of withdrawal into the lens mount or of outward extension. In the outwardly extended position shown in the figure, the ends of said jacks define the second reference plane.

Three jacks would be sufficient to define said plane but it is preferable to increase the number of jacks in order to limit any possible bending of the sensitive plate. Since square are employed in the apparatus herein described, provision has been made for four jacks in this example of construction.

It is preferable to determine the jack bearing positions on the periphery of the plate in order to limit the consequences of any possible damage to the sensitive layer. In the case of an apparatus of the type herein described which permits the use of several plate sizes, several sets of jacks are accordingly employed and disposed in concentric rings around the lens 106. One of these sets is selected according to the dimensions of the plate employed.

FIG. 3 is a fragmentary sectional view of one of these jacks. The lens mount 201 comprises a lower plate 301 and an upper plate 302. A cavity 303 cut in the plate 302 forms a cylinder in which is slidably mounted a piston 304, said piston being fitted with a seal 305. Said cavity is put under pressure by means of a pipe 306. The piston is fitted with a thrust rod 307 which is slidably mounted within a bore pierced in the plate 301. The piston is urged upwards by a restoring spring 308.

In actual practice, the ranges of travel employed are very small and considerably shorter than those which have been shown in the drawings for the sake of enhanced clarity. In a typical case, the stroke of the piston is 0.5 mm and the distance of projection of the rod 307 from the bottom plane of the plate 301 is 40 $\mu$m in the outwardly displaced position. This makes it possible to employ very close adjustments which serve to obtain the desired degree of precision in conjunction with very accurate machining.

FIG. 4 is a plan view of the table 104 in the case of a design which is intended to permit the use of several sizes of plates. The locations occupied by said plates are represented by the chain-dotted lines I and II. In order to position the plates on the table, there is employed a set of three studs 401 having the shape of drawing-pins which can be placed within holes. A first set of holes 402 to 404 defines location I and a second set of holes 405 to 407 defines location II. The plates are held in position on the table by means of a suction system consisting of a lattice of intersecting grooves 408 beneath location I and of a peripheral groove 409 beneath location II. A pressure-reduction pipe 410 serves to suck air from a cavity which is formed beneath the grooves 408 and communicates with these latter through a series of holes 411. A branch pipe 412 serves to suck air from the groove 410 through the hole 413. The positioning hole 404 opens into the pipe 412; when the studs 401 delimit location I, one of said studs is pressed downwards into the hole 404 and seals-off said pipe 412. Thus the suction is not liable to be disturbed when the groove 409 is connected to the external atmosphere. There have also been placed at the bottom of the holes 403 and 406 insulated electric contacts which are connected respectively to the lead wires 414 and 415. Thus the stud which is placed either in the hole 403 or in the hole 406 establishes a connection between the table 104 and one of the leads 414 and 415, with the result that an indication of the size of plate employed can be given to the control unit 107. The same two functions can be performed by means of a single stud which can thus serve both to plug the pipe and to establish the desired contact.

The general layout of the fluidic and electric logical system for controlling the position-setting of the table is shown in FIG. 5 in the case of an apparatus which permits the use of two plate sizes. Two hand-operated air valves each serve to operate a set of jacks corresponding to one plate size. The figure shows two jacks 202 of one of said sets in the outwardly extended position of the lens mount 201. Said two jacks are applied against a sensitive plate 105 carried by a table 104 which is secured to a spherical bearing comprising a spherical piston 503 and a base 504.

The plate 105 is positioned on the table 104 by means of studs 401, only one stud being shown in the figure. Said stud also establishes an electrical connection between ground M and a circuit $S_1$. For the other plate size, this connection would be made between M and $S_2$.

Said connection serves to open an electrovalve 505 and to initiate rotation of a rotary electromagnet 506, these latter being both connected to a positive voltage source. The other plate size corresponds to the electrovalve 508 and to the electromagnet 507.

The electromagnet 506 thus uncovers the valve 501 by rotating a masking shutter 509 which constitutes both an indicator and a safety device for preventing operation of the valve when a plate of the other size is fixed on the table. The electromagnet 507, which is not in operation, then masks the valve 502.

The valves 501 and 502 are fed by a compressed-air supply network AC. By actuating the valve 501 which has been uncovered by the shutter 509, said compressed air passes through the electrovalve 505 which is open as noted above and terminates in the set of jacks 202 which extend from the lens mount 201.

The outlets of the valves 505 and 508 are also connected to an OR fluidic circuit 511, the output of which is connected to a pressure contact 512. Thus, when a set of jacks is in the outwardly extended position, said pressure contact closes and applies the positive voltage to a third electrovalve 513 which then opens.

Action can then be produced on a hand-operated valve 514 which is connected to a vacuum-producing system VI. By opening said valve, a device contained within the base 504 is caused to operate by means of the electrovalve 513 and initiates upward displacement of the piston 503, thus applying the plate 105 against the jacks 202.

Upward displacement of the piston can thus be carried out only if the jacks are outwardly extended whereas the upward displacement of the piston stops if said jacks are caused to withdraw.

Another OR fluidic circuit 515 is connected to the outlets of the valves 501 and 502 and the output of said circuit is connected to a pressure contact 516. Said contact closes an electric circuit BL when one of the valves 501 or 502 is open. Said circuit BL is applied to the external mechanism 103 (not shown in the figure) which serves to displace the spherical bearing on the table 101 of FIG. 1. The closed state of the circuit serves to inhibit the operation of the displacement mechanism, thereby preventing the jacks 202 from scoring the plate 105 as a result of any accidental displacement of this latter.

When the plate is held in a stationary position against the jacks, a hand-operated valve 517 which is connected to the vacuum system is then opened. This initiates the operation of a locking device which is contained within the base 504 and which locks the piston 503 within said base while preventing any relative motion of these two components. The air contained within the grooves of the table 104 is withdrawn by suction at the same time and the atmospheric pressure has the effect of holding the plate 105 in a stationary position on said table.

The sensitive surface of the plate is thus placed in position and maintained in the second reference plane as desired. By actuating the valve 501, it is then possible to cause upward displacement of the jacks within the lens mount. By so doing, the pressure contact 516 opens the circuit BL and the displacement mechanism is capable of operating freely. The piston-operating device is then no longer actuated but the locking device prevents any movement of the piston.

The sensitive surface of the plate is then ready to be exposed.

What is claimed is:

1. An optical projection system equipped with a plate positioner of the type comprising a spherical bearing adjustable for height and angular position-setting, a plate supported by said spherical bearing and having a free face to be positioned in a reference plane, a lens defining said reference plane, and means for controlling the movements of said spherical bearing, wherein said optical system further comprises at least one set of extensible jacks which are rigidly fixed to the lens and the ends of which are located in the reference plane in the outwardly displaced position of the jacks, the control means being adapted to apply the free face of said plate against the outwardly displaced ends of said jacks and then to lock the spherical bearing in the position thus determined.

2. An optical system as defined in claim 1, wherein the spherical bearing supports a table adapted to receive the plate and provided with pressure-reducing means for immobilizing the plate and with at least two sets of holes for receiving a set of studs in order to position said plate on said table, the studs being placed within the set of holes corresponding to the dimensions of the plate and at least one stud aforesaid being capable of plugging a pressure-reduction pipe in order to put a part of the pressure-reduction means out of service according to the dimensions of the plate.

3. An optical system as defined in claim 2, wherein one hole of each set of holes is provided with an electric contact which is intended to be actuated by the stud placed within said hole and forms part of an electric circuit which is connected to the control means and serves to provide said means with an indication of the dimensions of the plate employed.

4. An optical system as defined in claim 3, wherein said system comprises a number of sets of jacks corresponding to the number of sets of holes and wherein the control means comprise hand-operated valves corresponding to the plate dimensions defined by the sets of holes and the sets of jacks, and movable shutters for covering the openings which provide access to said valves, each shutter being capable of displacement under the control of the electric circuit which is actuated by the stud after insertion of said stud within the hole which is provided with a contact and forms part of the set of holes corresponding to the valve to be uncovered.

5. An optical system as defined in claim 1, wherein the control means comprise first means for actuating the spherical bearing, second means for outwardly displacing the jacks, and third means for preventing operation of the first means when said jacks are withdrawn.

* * * * *